(12) United States Patent
Maigret et al.

(10) Patent No.: US 6,747,477 B2
(45) Date of Patent: Jun. 8, 2004

(54) PROGRAMMABLE DATA DEVICE AND METHOD THEREFOR

(75) Inventors: Robert Maigret, Warwick, RI (US); Thomas Somerville, Tempe, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 28 days.

(21) Appl. No.: 10/217,661

(22) Filed: Aug. 13, 2002

(65) Prior Publication Data

US 2004/0032281 A1 Feb. 19, 2004

(51) Int. Cl.[7] .............................................. H03K 19/173
(52) U.S. Cl. ............................................ 326/38; 326/46
(58) Field of Search ............................... 326/38, 40, 46, 326/49, 50; 365/185.07, 185.16

(56) References Cited

U.S. PATENT DOCUMENTS 5,523,971 A * 6/1996 Rao ..................... 365/187.07
5,864,499 A * 1/1999 Roohparvar et al. ... 365/185.08

* cited by examiner

Primary Examiner—Daniel D. Chang
(74) Attorney, Agent, or Firm—Robert F. Hightower

(57) ABSTRACT

A programmable data latch (21) is disclosed. The data latch comprises a master latch (34) operable to load data into the data latch (21) and a slave latch (36) operable to receive the data and produce the output (20) and inverted output of the data latch (21). Also provided is a plurality of programmable floating gate transistor (53, 54) wherein the "on" or "off" state of the floating gate transistor (53, 54) is determined by the data loaded into the data latch (21). A programming voltage supply (26) is supplied to the floating gate transistors (53, 54) which increases the threshold voltage of the floating gate transistor (53, 54) in the "on" state and produces a programmed transistor. The programmed transistor is operable to set the state of the data latch (21) upon subsequent use.

20 Claims, 4 Drawing Sheets

PROGRAMMABLE DATA DEVICE AND METHOD THEREFOR

BACKGROUND OF THE INVENTION

The present invention relates, in general, to electronics, and more particularly, to methods of forming semiconductor devices and structure.

In the past, the electronics industry utilized programmable memory elements in various electronic systems for many different types of applications. Some programmable memory elements lost stored information if the memory element was not periodically refreshed. An erasable programmable read-only memory (EPROM) is one example of such a non-volatile memory. One problem with an EPROM is reliability. The reliability of information stored in the EPROM diminishes with the length of time that the EPROM is in operation with power applied. Typically, the EPROM was periodically refreshed in order to increase the reliability. However, separate sense amplifiers and other circuitry typically were required in order to provide the required refresh operations and also to perform a read operation of the programmable memory element. These separate sense amplifiers and circuitry increased the size of a semiconductor die that contained the programmable memory element thereby increasing the cost. The separate sense amplifiers and circuitry also consumed power thereby increasing the power consumption of the semiconductor die.

Accordingly, it is desirable to have a method of forming a programmable memory element that does not decrease reliability with the operating lifetime, that does not require periodic refreshing, and that does not require separate sense amplifiers and associated circuitry.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

The present description includes a method of forming a system having a programmable data device that has, among other features, reliability that does not decrease during the time the system is in operation, and that does not require separate sense amplifiers and associated circuitry thereby lowering costs.

Figure 1:
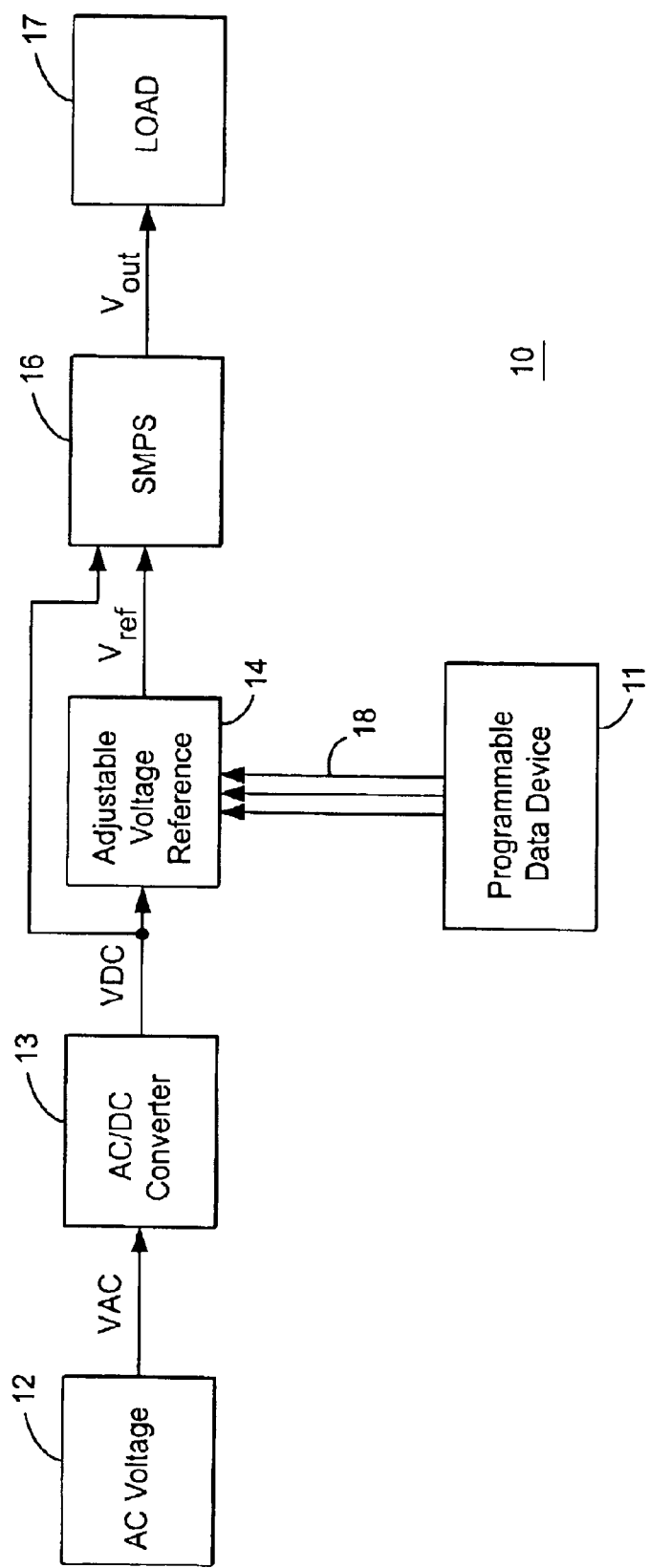
FIG. 1 schematically illustrates an embodiment of a portion of one example of a system in accordance with the present invention.

FIG. 1 schematically illustrates one example of an electrical system 10 in which a programmable data device may be used. Illustrated is an AC voltage source 12, an AC-to-DC (AC/DC) converter 13, an adjustable voltage reference 14, a programmable data device 11, a switch mode power supply (SMPS) 16, and a load 17. In operation, AC voltage source 12, such as a household AC mains, supplies AC voltage (VAC) to AC/DC converter 13. In a typical embodiment, AC/DC converter 13 uses a diode bridge to convert the AC voltage to a rectified DC voltage or unregulated DC voltage (VDC). The unregulated DC voltage supplies a DC potential to both adjustable voltage reference 14 and to switch mode power supply (SMPS) 16. Adjustable voltage reference 14 produces a stable reference voltage (Vref) that is supplied to SMPS 16. Adjustable voltage reference 14 is operable to adjust to changes in system 10 including changes in source 12 and converter 13 to maintain a stable value for the reference voltage (Vref). Such changes may result from various influences or factors including stress induced during manufacturing operations such as die separation or packaging. Programmable data device 11 provides output signals on outputs 18 that may be used to assist compensating for manufacturing variations in the value of the reference voltage (Vref).

Figure 2:
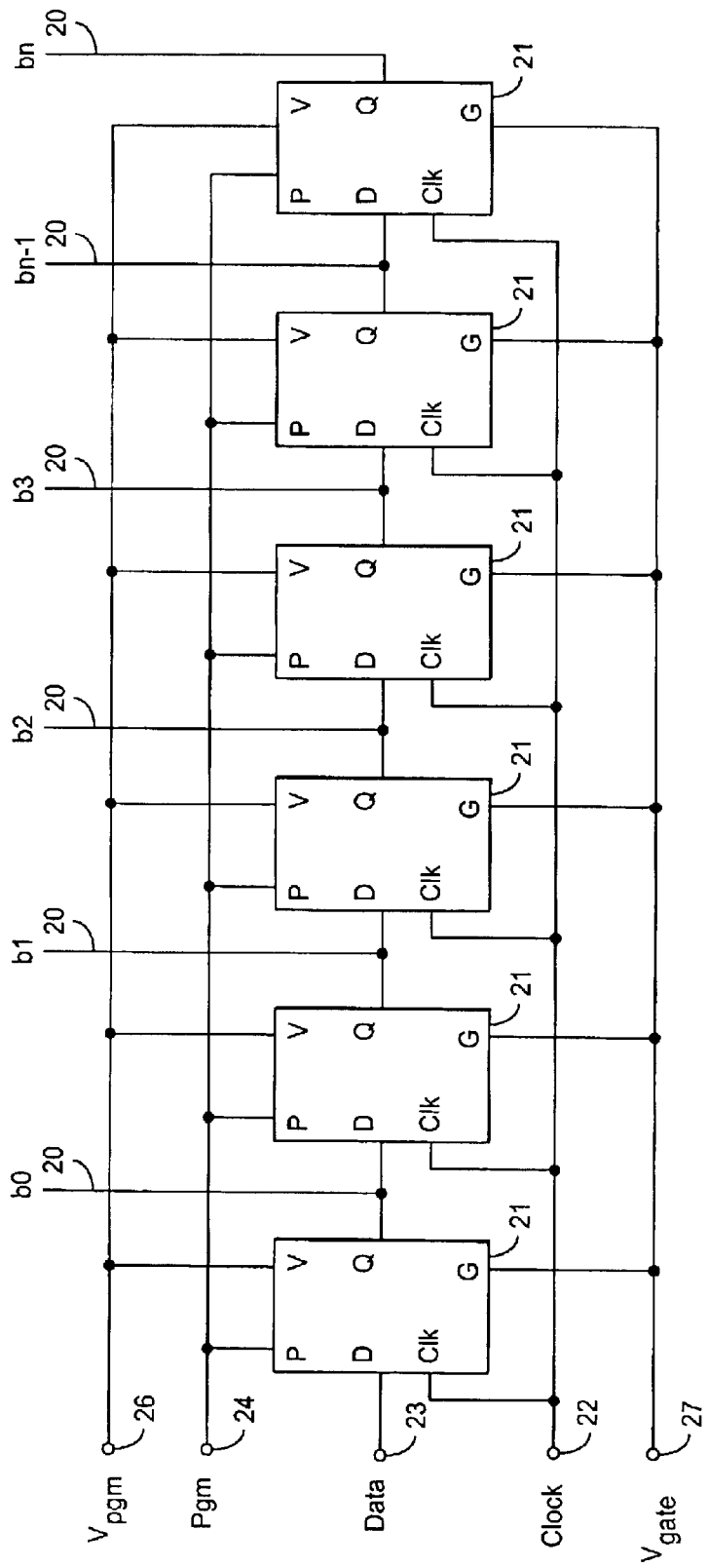
FIG. 2 schematically illustrates an embodiment of a portion of a programmable data device in accordance with the present invention.

FIG. 2 schematically illustrates an embodiment of a portion of programmable data device 11. Programmable data device 11 typically includes a plurality of individual programmable data elements that do not require periodic refreshing. Although in some embodiments, only one element may be utilized. Device 11 typically has n-individual data registers arranged in a serial shift register configuration. In the preferred embodiment, the registers are formed as n-individual data latches 21 that are arranged in such a serial shift register configuration. A data signal or data that is to be stored is presented to device 11 on a data input 23. Each latch 21 has an output 20 which typically is connected to one of outputs 18 shown in FIG. 1. Each latch 21 also has a clock input that is connected to receive a clock signal or clock on a clock input 22. As will be seen hereinafter in the description of FIG. 3, each latch 21 also has a P input, a V input, and a G input that are connected, respectively, to a Pgm signal input 24, a programming voltage (Vpgm) input 26, and a Vgate signal input 27 of device 11.

Device 11 has an acquisition mode, a latch mode, a programming mode, and a stored mode. During the acquisition mode, data is shifted into each latch 21 of device 11. During the latch mode, data currently shifted into the latch is held in latches 21 and is also available on outputs 20 for testing and other purposes. During the programming mode, the data that is held in latches 21 is programmed into the latch for storage. During the stored mode, the programmed data is available at outputs 20. A Pgm signal or Pgm is applied to input 24 as a control signal that indicates a programming mode is in process when Pgm is a logic one and indicates that a programming mode is not in progress when Pgm is a logic zero. The programming voltage Vpgm that is applied to input 26 is a voltage source that is applied to effect programming of data during the programming mode. The Pgm signal is a logic zero during all modes except the programming mode, and the Vpgm voltage typically is only applied during the programming mode. Typically, the programming voltage is much greater than the value of the voltage used for operating device 11. The Vgate signal or Vgate that is applied to input 27 is a control signal that is used to read the contents of the storage elements. The value of Vgate is selected to ensure that transistors 53 or 54 will be on when unprogrammed and off when programmed.

During the acquisition mode, device 11 loads data from data input 23 into the first latch 21 after a rising clock signal is applied to clock input 22. The first latch 21 has an output 20 that is designated as b0. Subsequent rising clock signals transfer data from the first latch 21 into the next successive latch 21, for example the value on b0 is transferred to b1. After n rising clock signals, all data latches 21 of device 11 are loaded with data. After all data latches 21 are loaded, the read-out mode typically is used to read the latched data and verify the data. The programming mode is used to store the value of each latch 21 into a memory storage element within that respective latch. After the programming is complete, the memory storage element is not powered but the stored data is available for subsequent use even after repeated power-down and power-up sequences.

Figure 3:
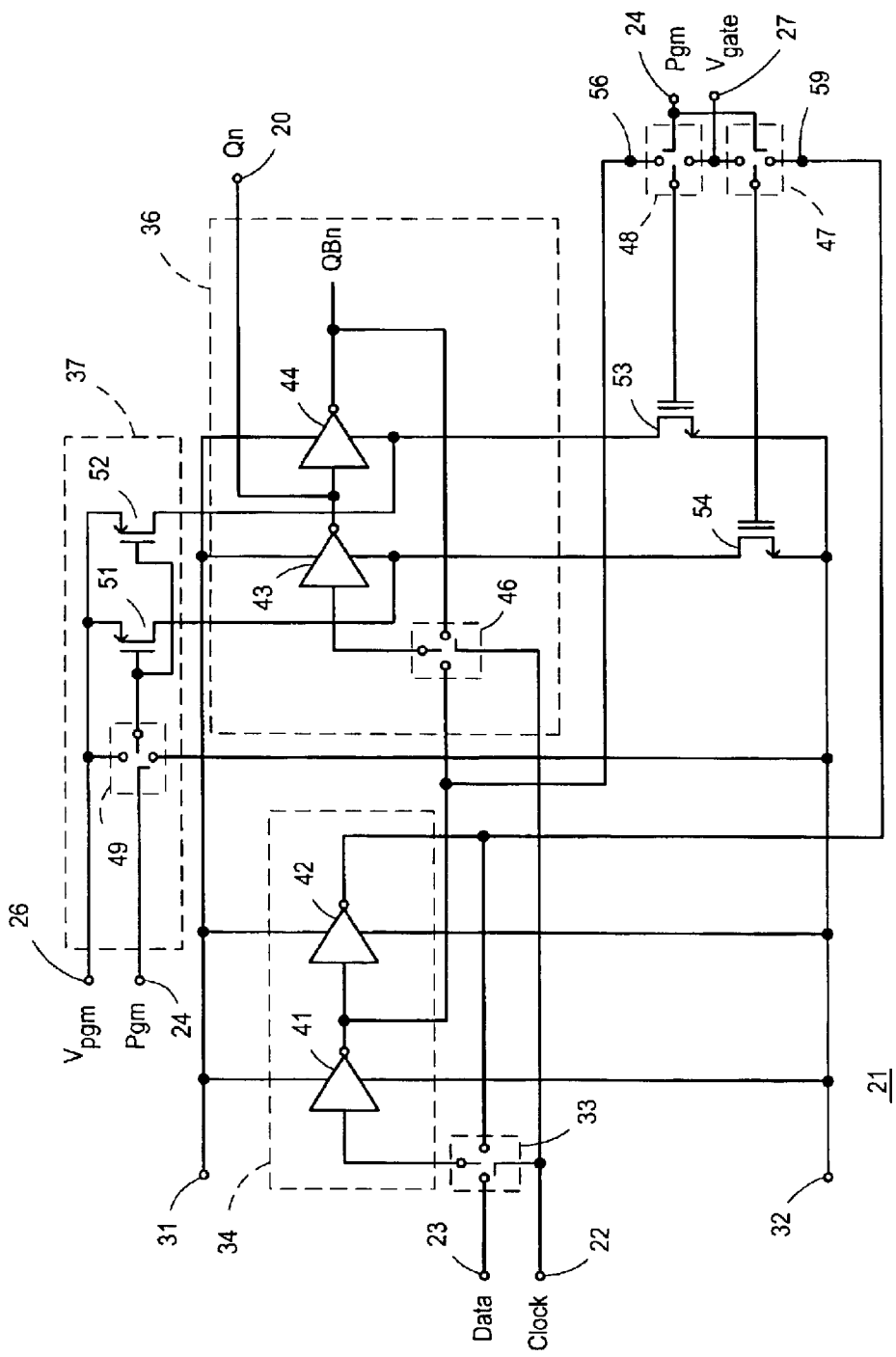
FIG. 3 schematically illustrates an embodiment of a portion of the programmable data device of FIG. 2 in accordance with the present invention.

FIG. 3 is a schematic further illustrating a portion of an embodiment of one data latch 21 of programmable data device 11 illustrated in FIG. 2. Latch 21 is formed to include a master latch 34, a slave latch 36, and a programming circuit 37. Latch 21 is also formed to include two memory storage elements including a first storage element and a second storage element. In the preferred embodiment, the first storage element and the second storage element are a first floating gate transistor 54 and a second floating gate transistor 53, respectively. However, the storage element may be other types of elements including Electrically Erasable Programmable Read Only Memory (EEPROM). Floating gate transistors are well known to those skilled in the art. Master latch 34 includes an inverter 41 and an inverter 42 with an output of inverter 41 connected to an input of inverter 42. Slave latch 36 includes an inverter 43 and an inverter 44 with an output of inverter 43 connected to an input of inverter 44. Inverters 41 and 42 are formed to receive operating potential from a voltage source input 31 and a voltage return 32. Inverters 43 and 44 also are formed to receive operating potential from input 31 but are connected to power return 32 through transistors 54 and 53, respectively. Thus, as will be seen hereinafter, the state of transistors 53 and 54 control the state of inverters 44 and 43. Input 31 and return 32 are not shown in FIG. 2, however, voltage source input 31 typically is coupled to receive the VDC voltage from the output of converter 13 shown in FIG. 1.

A first switch or switch 33 is used to select a data source for master latch 34 and a second switch or switch 46 is used to select a data source for slave latch 36. A third switch or switch 47, a fourth switch or switch 48, and a fifth switch or switch 49 are used for programming transistors 53 and 54 during the programming mode. Switches 33, 46, 47, 48, and 49 are steering elements and may be a variety of implementations including a multiplexer or a plurality of metal oxide semiconductor field effect transistors (MOS transistors or MOSFETs) formed as coupling devices. Switches 33, 46, 47, 48, and 49 are generally illustrated by dashed boxes with an "L" symbol within the box. The "L" symbol of switches 33, 46, 47, 48, and 49 is the control input for the switch. The switch output is the terminal on the opposite side of the switch from the "L" symbol. The other terminals of the switch are signal inputs. The "L" symbol points to the input terminal that is connected to the output terminal during the active or on-state and the other input terminal is connected to the output terminal in the normal or off-state of the switch. As explained in the description of FIG. 2, latch 21 has a Pgm signal input 24, a programming voltage (Vpgm) input 26, and a Vgate signal input 27 that correspond respectively to the P input, V input, and G inputs shown in FIG. 2.

The table below shows the state of switches 33, 46, 47, 48, and 49 for the different modes of latch 21.

|  | Switch No. | | | | |
|---|---|---|---|---|---|
| MODE | 33 | 46 | 47 | 48 | 49 |
| Acquisition | 1 | 1 | 0 | 0 | 0 |
| Latch | 0 | 0 | 0 | 0 | 0 |
| Programming | 0 | 0 | 1 | 1 | 1 |
| Stored | 0 | 0 | 0 | 0 | 0 |

In order to acquire data for programming, switches 33, 46, 47, 48, and 49 are set to place latch 21 in the acquisition mode. Transistors 53 and 54 are unprogrammed during this mode. For the case where transistors 53 and 54 are reprogrammable devices, they typically are erased prior to entering the acquisition mode. During the acquisition mode, Pgm is a logic zero, thus, switches 48 and 47 are in the normal or off-state to route control signal Vgate to the gates of floating gate transistors 53 and 54. The value of Vgate causes unprogrammed transistors 53 and 54 to be conductive and connect inverters 43 and 44 to return 32. Switch 49 is in the normal or off-state and connects the gates of transistors 51 and 52 to the programming voltage Vpgm, thus, transistors 51 and 52 are disabled to isolate transistors 53 and 54 and inverters 43 and 44 from Vpgm. Switches 33 and 46 are used to enter and latch data that is applied to data input 23. Switch 33 is formed to connect the input of inverter 41 either to the output of inverter 42 or to receive data on data input 23 depending on the state of the clock signal or clock on clock input 22. When clock is a logic one, switch 33 is in the on-state and connects the input of inverter 41 to receive the data signal. The falling edge of clock changes switch 33 to the normal or off-state to connect the input of inverter 41 to the output of inverter 42, thus, latching the value received from data input 23 into master latch 34.

Depending on the state of the clock signal, switch 46 switches to connect the input of inverter 43 either to the output of inverter 41 in order to receive data from latch 34, or to the output of inverter 44 to latch the data received. When clock is logic one, switch 46 is in the active or on-state and the output of inverter 44 is connected to the input of inverter 43 to store data previously received by inverter 44. The falling edge of clock changes switch 46 to the normal or off-state to connect the output of inverter 41 to the input of inverter 43 in order to receive the previous data supplied to the input of and stored in slave latch 36. Upon the next rising edge of clock, switch 46 switches to again connect the input of inverter 43 to the output of inverter 44 to latch the data while latch 34 is receiving new data. The output of inverter 43 supplies the Qn signal on output 20, and the output of inverter 44 is an inverted output Q-bar or QBn. This method of entering data and latching data is repeated until all latches 21 of device 11 have latched data. By way of an example, in the acquisition mode, the rising clock signal on clock input 22 causes switch 33 to load data in master latch 34 from data input 23. If the data on input 23 is logic one, then the output of inverter 41 is logic zero and the output of inverter 42 is logic one. While the clock signal is high, slave latch 36 has the output of inverter 44 coupled to the input of inverter 43 by switch 46 to store the previous data. When the clock signal returns to logic zero, switch 33 connects the output of inverter 42 to the input of inverter 41 thereby latching the states of inverters 41 and 42. The logic zero clock signal places switch 46 in the off-state to connect the input of inverter 43 to the output of inverter 41, thus, inverter 43 receives a logic zero. The next rising clock edge places switch 46 in the on-state to connect the input of inverter 43 to the output of inverter 44 thereby latching the data in slave latch 36. Once the data values are latched into each latch 21 during the acquisition mode, the latched data is available for use on outputs 20 but is not yet programmed into latches 21. Prior to programming, the data may be changed or verified.

Once the desired data is latched, the data may be programmed into transistors 54 and 53 during a programming mode. While prior circuits require separate sense amplifiers and read operations to refresh data outputs, device 11 provides a way to program each latch 21 of device 11 such that subsequent power-on events will result in repeatable latch output states. During the programming mode, the Pgm signal is at a one ("1") state to control switches 47-49, and clock is held at a zero ("0") state to ensure that the data latched in latch 21 is not changed. Programming control circuit 37 along with switches 47 and 48 facilitate programming transistors 53 and 54. Programming control circuit 37 comprises a p-channel MOSFET switch or p-channel MOSFET or p-channel transistor 52, a p-channel MOSFET switch or p-channel MOSFET or p-channel transistor 51, switch 49, and the programming voltage (Vpgm) supplied on input 26. It should be noted that transistors 51 and 52 may be other types of devices in other embodiments, for example PNP bipolar transistors. During the programming mode, switch 49 is in the active or on-state to connect the gates of transistors 52 and 51 to return 32 thereby enabling or making transistors 52 and 51 conductive to apply the programming voltage (Vpgm) to the drain of transistors 53 and 54 via a connection from the drain of transistor 52 to the drain of transistor 53 and another connection from the drain of second transistor 51 to the drain of transistor 54. The logic one on PGM input 24 also changes switches 47 and 48 to the active or on-state to respectively connect the gate of transistor 54 to the output of inverter 42 in order to program that value into transistor 54 and to connect the gate of transistor 53 to the output of inverter 41 in order to program that value into transistor 53. Since inverters 43 and 44 are always in opposite states, only one transistor of transistors 53 and 54 will be programmed. The programming shifts the value of the threshold voltage of the programmed transistor thereby requiring a higher gate voltage to turn the transistor on.

During the storage mode, the value of the applied gate voltage is not sufficient to turn-on the programmed transistor, thus, it is always off and the other or unprogrammed one is always on. The programmed transistor is the one connected to the inverter that is in the "high" or one ("1") state with the output at a high voltage. As is well known by those skilled in the art, the inverter output has two transistors connected in a totem pole arrangement. Since this inverter is on, the upper output transistor is on and the lower output transistor is off. Thus, the programmed transistor is "on" but the drain is not connected to any voltage because the lower output transistor of the inverter is "off". The opposite is true for the other inverter and the unprogrammed transistor. The lower output transistor of the inverter is "on" and the unprogrammed transistor is "on" to connect the inverter to return 32, but the upper output transistor is off. Thus, no power is applied to the drain of the unprogrammed transistor. Consequently no power is applied to the drain of either of transistors 53 or 54 after the transistors are programmed. Those skilled in the art will realize that during power-up, power may be applied for a very brief time as the voltage level of the input voltage is increasing.

An additional advantage is provided by latch 21. As is known by those skilled in the art, over time the threshold voltage of the programmed transistor may drift toward the unprogrammed value. However, the state of inverters 43 and 44 during a power-up sequence is determined by the last transistor that reaches the threshold voltage. Thus, as long as one transistor has a threshold voltage that is higher than the other, the desired state will always be forced at power-up regardless of the absolute value of the threshold voltage.

In operation, programming supply voltage (Vpgm) is provided on input 26, and the programming signal (Pgm) on input 24 is a logic one to operably close switch 49. This allows current (from the Vpgm voltage) to flow from the sources to the drains of both first transistor 52 and second transistor 51 to first floating gate transistor 53 and second floating gate transistor 54, respectively. The programming signal (Pgm) also places switches 48 and 47 in the off-state which establishes either a logical one or zero at the gate of floating gate transistors 53 and 54 depending on the value at a first point 56 and a second point 59. In the example described previously, first point 56 was a logic zero and second point 59 was a logic one. Current will flow through the one of transistors 53 or 54 with the gate voltage at the "1" value and this will increase the threshold voltage of the floating gate transistor.

In the above example, the value of the outputs of inverters 41 and 42 cause the threshold for first floating gate transistor 53 to increase while second floating gate transistor 54 remains the same. On subsequent power-up sequences, the changed threshold voltage will setup the Qn and QBn values due to the higher on-resistance of the threshold-shifted transistor as described herein previously. Thus, the latches of device 11 may be programmed and the data retained without sense amplifiers and associated circuitry.

After transistors 53 and 54 are programmed, latch 21 is formed to only apply power to transistors 53 and 54 during an initial power-on sequence and to not apply power to transistors 53 and 54 thereafter. During the initial power-on sequence, the state of slave latch 36 is forced to be the same as the state of transistors 53 and 54. This method increases the useful lifetime of the data stored in transistors 53 and 54 because the transistors are only powered for a brief time during power-on thereby increasing the reliability of data stored therein.

Device 11 can be checked to determine if the threshold voltages of first floating gate transistor 53 or second floating gate transistor 54 have shifted back to their preprogrammed value. This can be done by applying a Vgate voltage that is low enough to turn-on unprogrammed transistors but to not turn on programmed transistors if the thresholds have not shifted back toward the unprogrammed values. Switch 49 is turned-on at the same time but switches 47 and 48 are turned-off. Under normal conditions, one-half of transistors 53 and 54 are programmed, thus, one-half of the transistors should turn-on under these conditions. The value of the current at input 26 is noted as I1. Then the value of Vgate is increase to a value that is sufficient to turn-on all of transistors 53 and 54. The current at input 26 should now be twice the value recorded as I1. If the ratio is not 2:1 then some of transistors 53 and 54 have drifted back to a value that is close to the unprogrammed value. The value of the ratio can be used to determine the number of transistors 53 and 54 that have drifted. For example, assume there are five (5) latches 21, thus, ten (10) transistors 53 and 54. If one transistor has drifted to the unprogrammed value, the ratio of the currents will be 10:6 or 1.67:1 instead of 10:5 or 2:1. Another way of viewing this is that a logic zero is applied to data input 23 and the current of the Vpgm voltage supply is monitored after applying a logic one to Pgm input 24. This current is denoted as I1. A logic value of one is applied to input 23 of device 11 and the supply current is monitored when applying a logic one or program command to Pgm input 24. This produces a program current IP. If I1 is greater than IP, then the last bit has a stored value of logic one. If I1 is less than IP, then the last bit has a stored value of zero. The change in the threshold voltage of the programmed transistor can be calculated as:

$$\Delta V_t = \sqrt{\frac{2I_d}{SK_p}} - \sqrt{\frac{2I_{dp}}{SK_p}}$$

Where:
$I_d$=I1/n
$I_{dp}$=IP−(n−1/n) I1
S=Width/Length of the Transistor
Kp=$\mu_p C_{OX}$
$\mu_p$=hole mobility of the transistor
 (a fixed value determined by design)
$C_{OX}$=oxide capacitance per unit area
 (a fixed value determined by design)
n=number of data latches.

Figure 4:
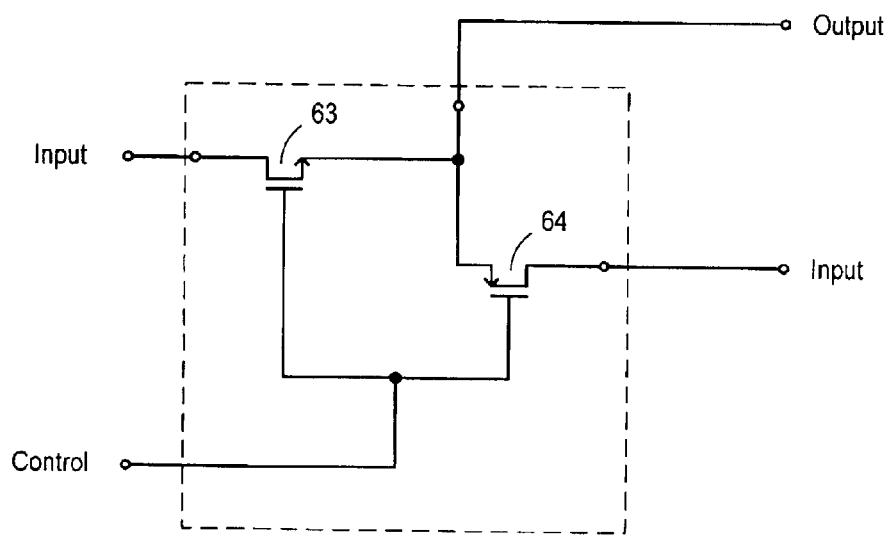
FIG. 4 schematically illustrates an embodiment of a portion of the device of FIG. 3 in accordance with the present invention.

FIG. 4 schematically illustrates a portion of an embodiment of one switch of the plurality of switches of FIG. 3. The switch includes a first switch transistor 63 and a second switch transistor 64. Transistor 63 has a source connected to an output of the switch, a drain connected to a first input of the switch, such as data input 23, and a gate connected to a control input of the switch. Transistor 64 has a source connected to the output of the switch, a drain connected to a second input of the switch, and a gate connected to the control input of the switch. Transistor 63 is illustrated as a N-channel MOS transistor and transistor is illustrated as a P-channel transistor, although other transistors may be used as long as the switch function is implemented.

Figure 5:
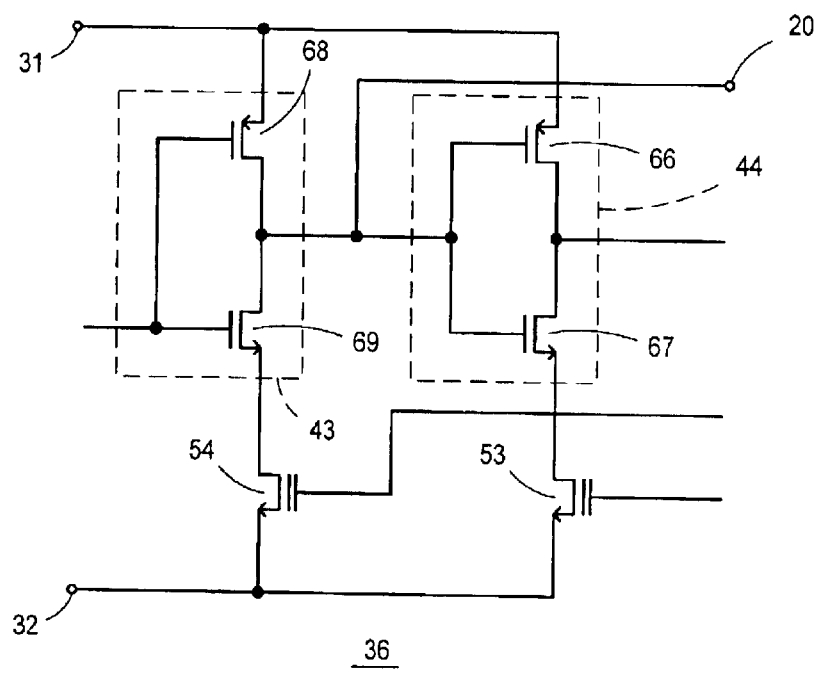
FIG. 5 further schematically illustrates an embodiment of another portion of the device of FIG. 3 in accordance with the present invention.

FIG. 5 schematically illustrates a portion of an embodiment of latch 36 shown in FIG. 3. Inverters 43 and 44 each include a pair of transistors connected to a totem pole configuration. Inverters 43 and 44 may include other transistors that are not shown for simplicity of the description. Transistors 54 and 53 are connected between inverters 43 and 44, respectively, and power return 32. Inverter 43 includes a top transistor 68 and a bottom transistor 69. Similarly, inverter 44 includes a top transistor 66 and a bottom transistor 67. Transistor 67 has a first current carrying electrode or source connected to a drain of transistor 53, a second current carrying electrode or drain connected to the output of inverter 44 and to a drain of transistor 66, and a control electrode or gate connected to the input of inverter 44. Transistor 66 has a drain connected to input 31, and a gate connected to the input of inverter 44. Transistor 53 has a source connected to return 32 and a control electrode or gate connected to switch 47 (See FIG. 3).

Transistor 69 has a first current carrying electrode or source connected to a drain of transistor 54, a second current carrying electrode or drain connected to the output of inverter 43 and to a drain of transistor 68, and a control electrode or gate connected to the input of inverter 43. Transistor 68 has a source connected to input 31, and a gate connected to the input of inverter 43. Transistor 54 has a source connected to return 32 and a control electrode or gate connected to switch 47 (See FIG. 3).

Thus, apparatus and method for a programmable data latch is disclosed. Although details of the circuits have been described, a myriad of changes, variations, alterations, transformations and modifications may be suggested. It is intended that the circuit disclosed encompass such changes, variations, alterations, transformations and modifications and that they fall within the spirit and scope of the appended claims. For example a method is described with particular P-channel MOS transistors, however, although the method is directly applicable to N-channel transistors as well as NPN or PNP bipolar transistors in addition to other equivalent transistor structures. While device 11 has been shown utilized in a power supply circuit, device 11 can be used in any circuit or application that requires a data storage device that can reproduce its output values upon subsequent power-on cycles without the need for separate sense amplifiers and read operations to refresh data.

What is claimed is:

1. A method of forming a programmable data device comprising:

forming a first programmable transistor in series between a power return and a current carrying electrode of a lower output transistor of a first inverter and coupling the first programmable transistor to receive a state of an output of the first inverter;

forming a second programmable transistor in series between the power return and a current carrying electrode of a lower output transistor of a second inverter and coupling the second programmable transistor to receive a state of an output of the second inverter; and coupling the second inverter to receive the State of the output of the first inverter.

2. The method of claim 1 further including coupling a programming voltage input to a first current carrying electrode of the first programmable transistor and to a first current carrying electrode of the second programmable transistor.

3. The method of claim 1 further including forming an upper output transistor of the first inverter coupled between the lower output transistor and a power input and forming an upper output transistor of the second inverter coupled between the lower output transistor of the second inverter and a power input.

4. A method of forming a programmable data device comprising:

forming a first programmable transistor in series between a power return and a lower output transistor of a first inverter and coupling the first programmable transistor to receive a state of an output of the first inverter;

forming a second programmable transistor in series between the power return and a lower output transistor of a second inverter and coupling the second programmable transistor to receive a state of an output of the second inverter;

coupling the second inverter to receive the state of the output of the first inverter; and forming a third inverter and a fourth inverter coupled as a latch to receive data and coupling an input of the first inverter to receive a state of the latch.

5. The method of claim 4 wherein forming the first programmable transistor in series between the power return and the lower output transistor of the first inverter and coupling the first programmable transistor to receive the state of the output of the first inverter includes coupling a control electrode of the first programmable transistor to receive an output of the fourth inverter.

6. The method of claim 4 wherein forming the second programmable transistor in series between the power return and the lower output transistor of the second inverter and coupling the second programmable transistor to receive the state of the output of the second inverter includes coupling a control electrode of the second programmable transistor to receive an output of the third inverter.

7. The method of further including coupling an input of the latch to receive data from an input to the programmable data device.

8. A method of programming a data device of an electrical system comprising:

latching a data value into a register;

programming a floating gate transistor to a state in response to the data value; and coupling current flow through the register to a power return through the floating gate transistor responsive to the state of the floating gate transistor.

9. The method of claim 8 wherein programming the floating gate transistor to the state in response to the data value includes coupling an output of the register to a control electrode of the floating gate transistor.

10. The method of claim 9 further including the step of using the floating gate transistor to establish a state of the register for all subsequent uses.

11. The method of claim 9 further including the step of coupling the output of the register to a current adjustment circuit.

12. The method of claim 8 further comprising the step of coupling the register to a plurality of registers to form the data device.

13. The method of claim 8 further including coupling the data device to an adjustable voltage reference and coupling the adjustable voltage reference to a switch mode power supply and to an AC/DC converter.

14. The method of claim 13 further including the step of transferring the data value to a slave latch to establish the data value of the register.

15. The method of claim 8 further including the step of applying a programming voltage via a programming control line.

16. The method of claim 8 wherein programming the floating gate transistor includes shifting a threshold voltage of the floating gate transistor.

17. A programmable data latch comprising:

a master latch having an input coupled to receive data and an output, a slave latch having an input coupled to receive the master latch and an output, and including a first inverter having an output coupled to an input of a second inverter; and a first programmable transistor coupled to receive a state of the first inverter and a second programmable transistor coupled to receive a state of the second inverter, the first programmable transistor coupled in series between a power return and a power terminal of the first inverter and the second programmable transistor coupled in series between a power return and a power terminal of the second inverter.

18. The programmable data latch of claim 17 wherein an output of the programmable data latch is coupled to a current adjustment circuit.

19. The programmable data latch of claim 17 further comprising a plurality of latches configured as an EPROM.

20. The programmable data latch of claim 19 wherein the EPROM can be checked to determine if a threshold voltage of the EPROM has shifted back to their preprogrammed value by applying a logic "0" to a data line of the EPROM and monitoring a program supply after applying a program command to a programming line.

* * * * *

UNITED STATES PATENT AND TRADEMARK OFFICE
CERTIFICATE OF CORRECTION

PATENT NO. : 6,747,477 B2 Page 1 of 1
DATED : June 8, 2004
INVENTOR(S) : Robert Maigret and Thomas Somerville It is certified that error appears in the above-identified patent and that said Letters Patent is hereby corrected as shown below:

<u>Column 9,</u>
Line 8, insert -- claim 4 -- after "The method of".

Signed and Sealed this

Nineteenth Day of April, 2005

JON W. DUDAS
*Director of the United States Patent and Trademark Office*